(12) United States Patent
Ho et al.

(10) Patent No.: US 10,297,631 B2
(45) Date of Patent: May 21, 2019

(54) METAL BLOCK AND BOND PAD STRUCTURE

(71) Applicant: Taiwan Semiconductor Manufacturing Co., Ltd., Hsin-Chu (TW)

(72) Inventors: Cheng-Ying Ho, Minxiong Township (TW); Ching-Chun Wang, Tainan (TW); Dun-Nian Yaung, Taipei (TW); Feng-Chi Hung, Chu-Bei (TW); Yan-Chih Lu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 54 days.

(21) Appl. No.: 15/213,519

(22) Filed: Jul. 19, 2016

(65) Prior Publication Data
US 2017/0221950 A1    Aug. 3, 2017

Related U.S. Application Data

(60) Provisional application No. 62/288,738, filed on Jan. 29, 2016.

(51) Int. Cl.
*H01L 27/146* (2006.01)
(52) U.S. Cl.
CPC .... *H01L 27/14634* (2013.01); *H01L 27/1462* (2013.01); *H01L 27/1469* (2013.01);
(Continued)
(58) Field of Classification Search
CPC ......... H01L 27/14634; H01L 27/14643; H01L 27/1469
See application file for complete search history.

(56) References Cited

U.S. PATENT DOCUMENTS 6,495,814 B1 * 12/2002 Suzuki ............. H01L 27/14609
250/208.1
2011/0037137 A1    2/2011 Wehbe-Alause
(Continued)

FOREIGN PATENT DOCUMENTS

JP    2015128187 A    7/2015
KR    20110047133 A    5/2011

OTHER PUBLICATIONS

"Introduction to CMOS Image Sensors"; Microscopy Resource Center; http://www.olympusmicro.com/primer/digitalimaging/cmosimagesensors.html; Apr. 28, 2016, p. 1-15.

*Primary Examiner* — Monica D Harrison
*Assistant Examiner* — John Lin
(74) *Attorney, Agent, or Firm* — Eschweiler & Potashnik, LLC

(57) ABSTRACT

In some embodiments, the present disclosure relates to an integrated chip (IC) structure having a conductive blocking structure configured prevent radiation produced by a device within a first die from affecting an image sensing element within a second die. The IC structure has a first IC die with one or more semiconductor devices and a second IC die with an array of image sensing elements. A hybrid bonding interface region is arranged between the first and second IC die. A conductive bonding structure is arranged within the hybrid bonding interface region and is configured to electrically couple the first IC die to the second IC die. A conductive blocking structure is arranged within the hybrid bonding interface region and extends laterally between the one or more semiconductor devices and the array of image sensing elements.

20 Claims, 13 Drawing Sheets

(52) U.S. Cl.
CPC .. *H01L 27/14623* (2013.01); *H01L 27/14636* (2013.01); *H01L 27/14643* (2013.01); *H01L 2224/05* (2013.01); *H01L 2224/48451* (2013.01)

(56) References Cited

U.S. PATENT DOCUMENTS

| | | | |
|---|---|---|---|
| 2012/0105696 A1* | 5/2012 | Maeda | H01L 21/76898 348/302 |
| 2012/0199930 A1 | 8/2012 | Hayashi | |
| 2013/0105667 A1* | 5/2013 | Kobayashi | H01L 27/14634 250/208.1 |
| 2013/0134576 A1 | 5/2013 | Hayashi | |
| 2014/0339667 A1 | 11/2014 | Takahashi | |
| 2015/0053846 A1 | 2/2015 | Byun | |
| 2015/0076646 A1 | 3/2015 | Hsu | |
| 2015/0085978 A1 | 3/2015 | Massetti et al. | |
| 2016/0005781 A1 | 1/2016 | Lin et al. | |

\* cited by examiner

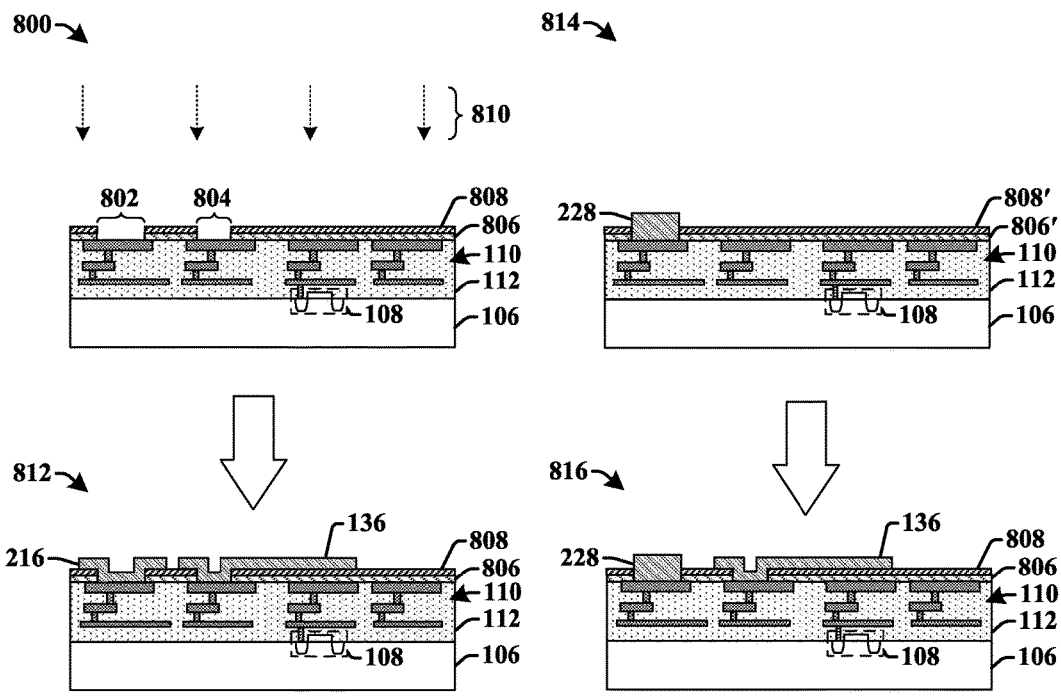
Fig. 8A  Fig. 8B
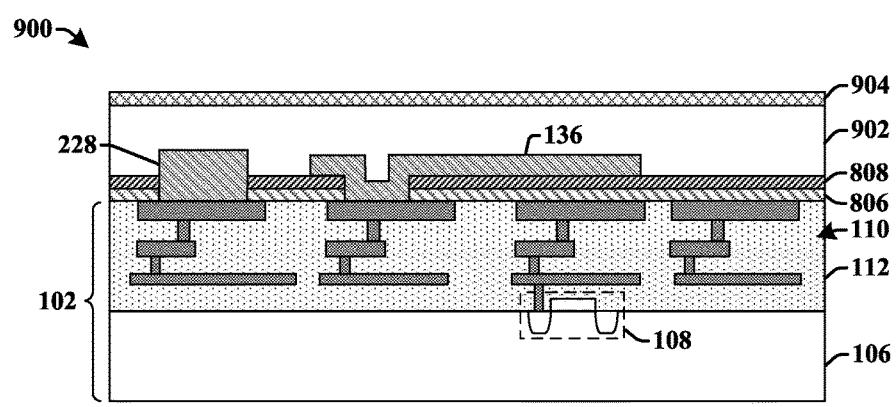
Fig. 9

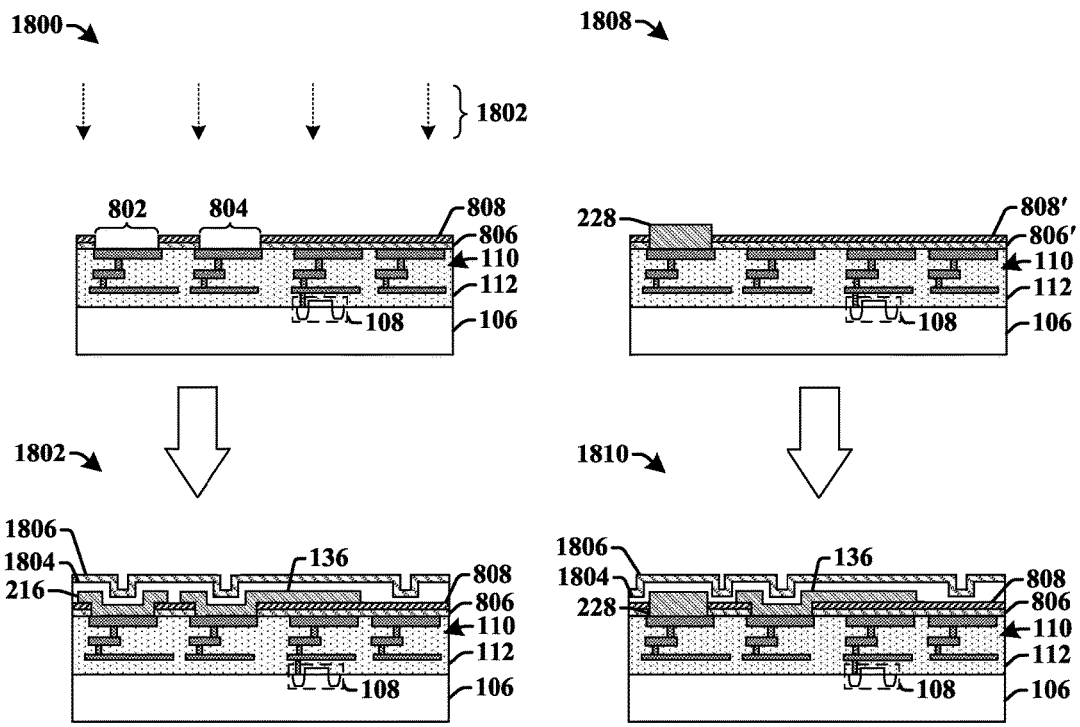
Fig. 18A                    Fig. 18B
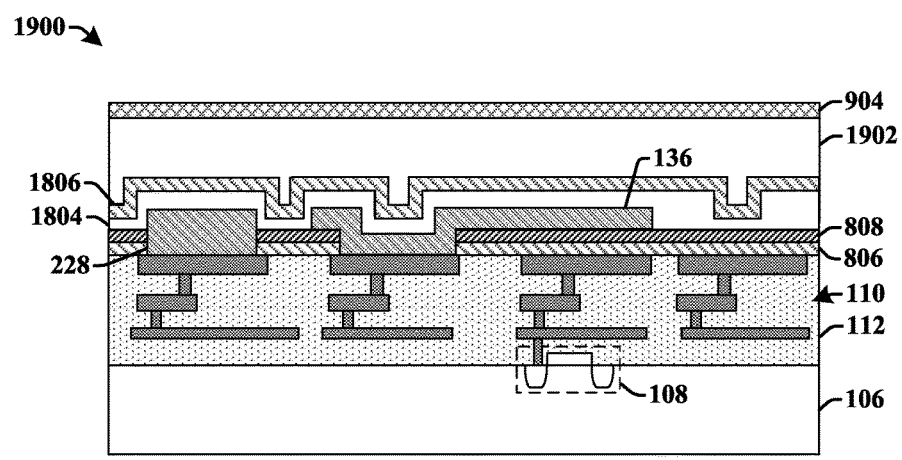
Fig. 19

METAL BLOCK AND BOND PAD STRUCTURE

REFERENCE TO RELATED APPLICATION

This Application claims priority to U.S. Provisional Application No. 62/288,738 filed on Jan. 29, 2016. The contents of which is hereby incorporated by reference in its entirety.

BACKGROUND

Integrated circuits (IC) with image sensors are used in a wide range of modern day electronic devices, such as cameras and cell phones, for example. Image sensors used in integrated circuits often comprise charge coupled devices (CCDs) or complementary metal-oxide semiconductor (CMOS) devices. Both types of devices work according to the photoelectric effect, in which incident radiation is converted to an electrical signal. In recent years CMOS image sensors have become popular due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-13 illustrate some embodiments of cross-sectional views showing a method of forming a stacked IC structure comprising a conductive blocking structure arranged between die electrically coupled by a single-damascene conductive bonding structure.

FIGS. 15-23 illustrate some embodiments of cross-sectional views showing a method of forming a stacked IC structure comprising a conductive blocking structure arranged between die electrically coupled by a dual-damascene conductive bonding structure.

DETAILED DESCRIPTION

Figure 1:
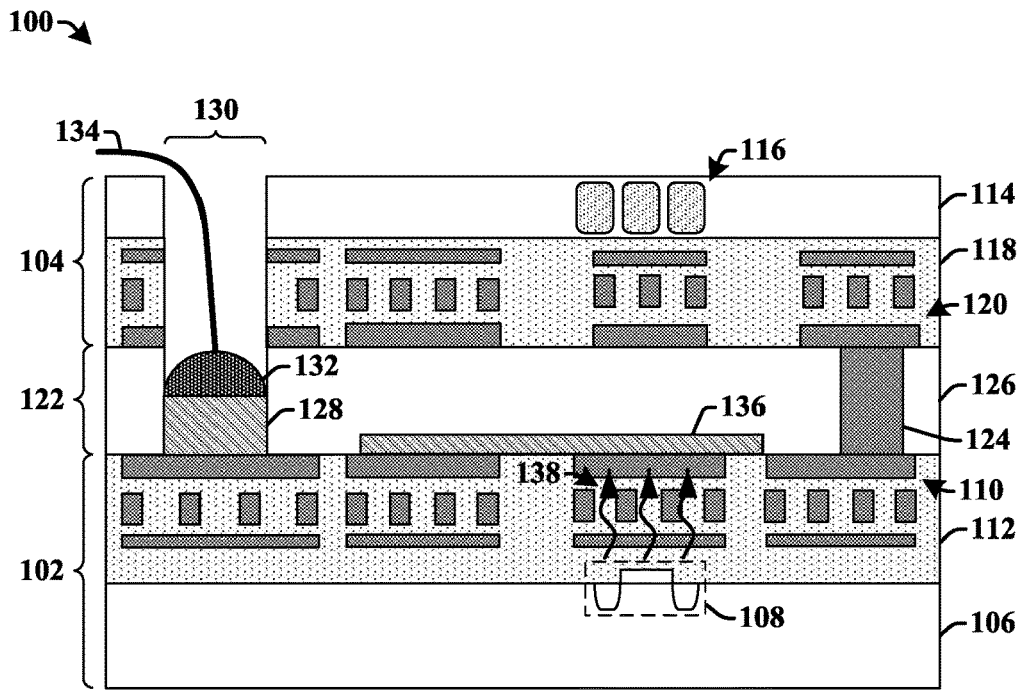
FIG. 1 illustrates a cross-sectional view of some embodiments of a stacked integrated chip (IC) structure having a conductive blocking structure configured prevent radiation produced by a device within a first die from affecting an image sensing element within a second die.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern image sensors are typically formed using semiconductor materials. This is because semiconductor materials have energy band gaps that allow for photons to be efficiently converted into charge carriers. For example, in an image sensor made of silicon (having a bandgap of 1.1 electron-volts (eV)), photons having an energy greater than 1.1 eV, which strike and are absorbed by the silicon will produce an electron-hole pair within the silicon. When a broad wavelength of visible light is incident on an image sensor, a variable number of electrons and/or holes are produced as a function of a wavelength and intensity of incident light striking the image sensor. The electrons can be converted into an image that is representative of the incident light.

It has been appreciated that for stacked image sensors (i.e., image sensors disposed within a semiconductor die that is stacked onto another semiconductor die) devices within a CMOS substrate may produce radiation (e.g., heat or light) during operation. For example, hot electron induced electron-hole pair recombination will cause a transistor device to emit light that may propagate in any direction. The radiation generated by the devices within the CMOS die may have sufficient energy to induce unwanted current in an image sensor. This unwanted current may act as an extra dark current source for an image sensor, thereby negatively affecting performance of the image sensor.

The present disclosure relates to a stacked integrated chip (IC) structure having a conductive blocking structure configured prevent radiation produced by a device within a first die from affecting an image sensing element within a second die. In some embodiments, the IC structure comprises a first IC die having one or more semiconductor devices and a second IC die having an array of image sensing elements. A hybrid bonding interface region is arranged between the first and second IC die. A conductive bonding structure is arranged within the hybrid bonding interface region and is configured to electrically couple the first IC die to the second IC die. A conductive blocking structure is arranged within the hybrid bonding interface region and extends laterally between the one or more semiconductor devices and the array of image sensing elements. The conductive blocking structure is configured to block radiation from the one or more semiconductor devices from reaching the image sensing elements, thereby preventing the radiation from inducing unwanted current in the array of image sensing elements.

FIG. 1 illustrates some embodiments of a stacked integrated chip (IC) structure 100 having a conductive blocking structure configured prevent radiation produced by a device within a first die from affecting an image sensing element within a second die.

The stacked IC structure 100 comprises a first integrated chip die 102 and a second integrated chip die 104. The first integrated chip die 102 comprises a first semiconductor substrate 106 having one or more semiconductor devices 108 (e.g., transistor devices, capacitors, inductors, etc.). A first plurality of metal interconnect layers 110 are arranged within a first dielectric structure 112 comprising one or more dielectric materials (e.g., a low-k dielectric material, silicon dioxide, etc.) arranged over the first semiconductor substrate 106. The second integrated chip die 104 comprises a second semiconductor substrate 114 having an array of image sensing elements 116 (e.g., photodiodes). A second plurality of metal interconnect layers 120 are arranged within a second dielectric structure 118 comprising one or more dielectric materials arranged between the first dielectric structure 112 and the second semiconductor substrate 114.

The first integrated chip die 102 is vertically stacked onto the second integrated chip die 104 along a hybrid bonding interface region 122 comprising a passivation structure 126. The hybrid bonding interface region 122 comprises a conductive bonding structure 124 arranged within the passivation structure 126. The conductive bonding structure 124 is configured to electrically couple the first plurality of metal interconnect layers 110 to the second plurality of metal interconnect layers 120. In some embodiments, the first integrated chip die 102 is stacked onto the second integrated chip die 104 in a face-to-face (F2F) configuration so that the first dielectric structure 112 faces the second dielectric structure 118.

A bond pad 128 may be arranged within the passivation structure 126 at a location laterally offset from the conductive bonding structure 124. The bond pad 128 comprises a conductive material (e.g., a metal such as aluminum) having an upper surface that is exposed by a bond pad opening 130 that extends through the second integrated chip die 104 and the passivation structure 126. The bond pad 128 is in electrical contact with the first plurality of metal interconnect layers 110 and provides an electrical connection between the stacked IC structure 100 and an external device. For example, a conductive bump 132 may be formed onto the bond pad 128 to connect the bond pad 128 to an external I/O pin of an integrated chip package by way of a bond wire 134.

A conductive blocking structure 136 is arranged within the passivation structure 126 at a location extending between the one or more semiconductor devices 108 and the array of image sensing elements 116, and laterally offset from the conductive bonding structure 124 and the bond pad 128. In some embodiments, the conductive blocking structure 136 may be arranged over the first plurality of metal interconnect layers 110 (i.e., over a top metal interconnect layer). The conductive blocking structure 136 is configured to block radiation 138 (e.g., light, heat, etc.) produced by the one or more semiconductor devices 108 within the first integrated chip die 102 from reaching the array of image sensing elements 116 within the second integrated chip die 104. By blocking the radiation 138, the conductive blocking structure 136 prevents unwanted current from being generated within the array of image sensing elements 116.

Figure 2A:
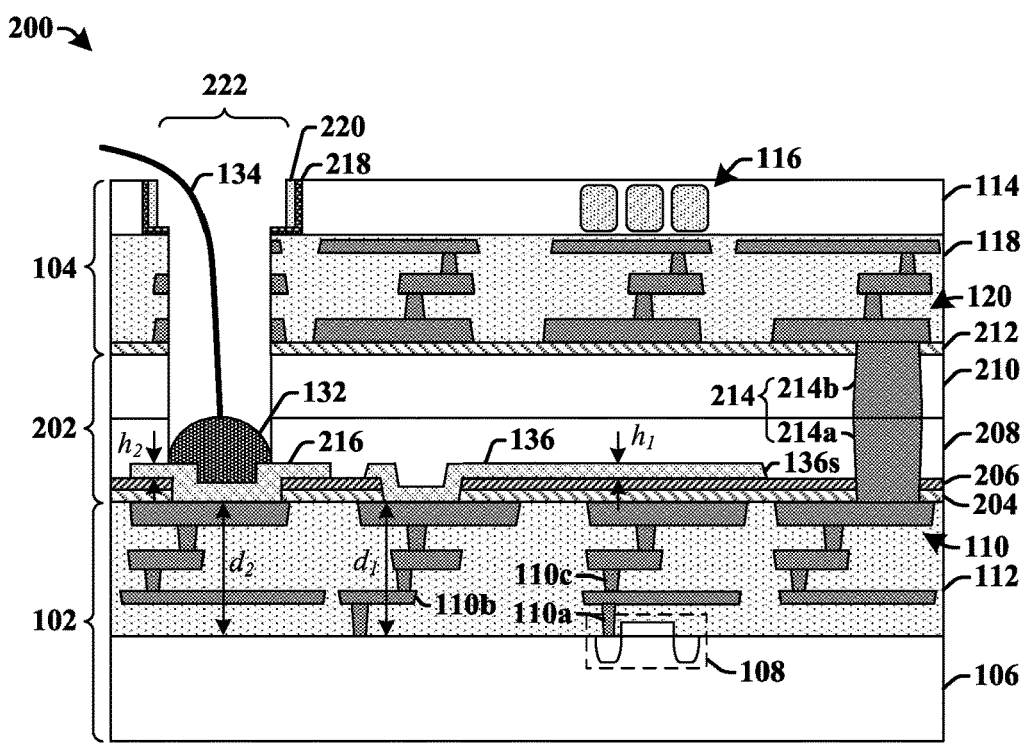
FIGS. 2A-2B illustrate cross-sectional views of some embodiments of stacked IC structures comprising a conductive blocking structure arranged between die electrically coupled by a single-damascene conductive bonding structure.
Figure 2B:
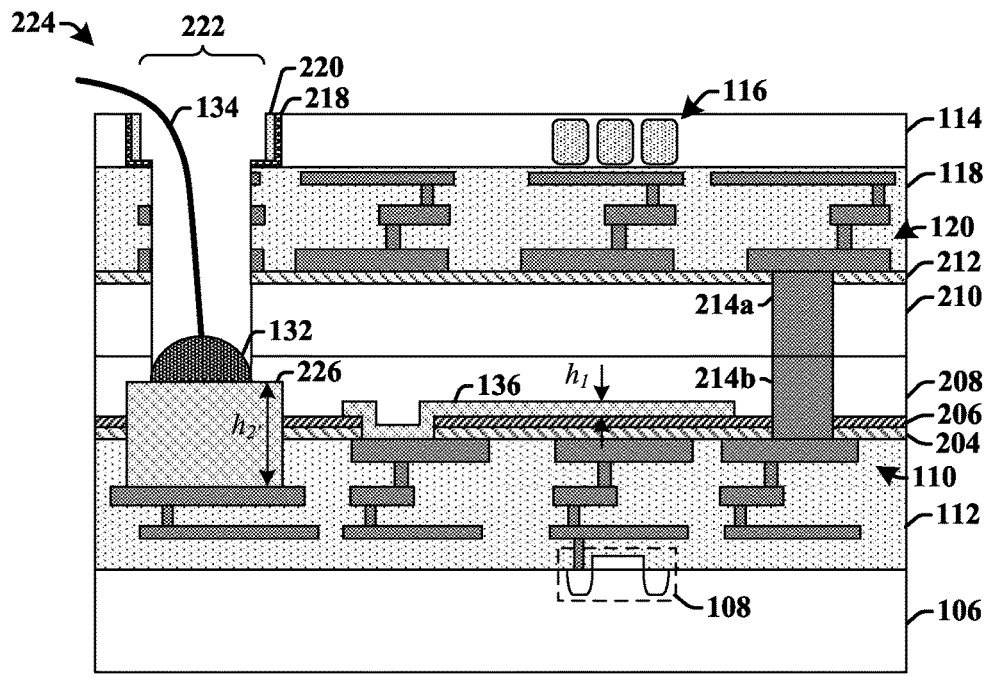

FIGS. 2A-2B illustrates cross-sectional views of some embodiments of a stacked IC structure comprising a conductive blocking structure arranged between die electrically coupled by a single-damascene conductive bonding structure.

The stacked IC structure 200 comprises a first integrated chip die 102 and a second integrated chip die 104. The first integrated chip die 102 comprises a first semiconductor substrate 106 having one or more semiconductor devices 108 (e.g., transistor devices, capacitors, inductors, etc.) and a first dielectric structure 112 having a first plurality of metal interconnect layers 110. The second integrated chip die 104 comprises a second semiconductor substrate 114 having an array of image sensing elements 116 (e.g., photodiodes) and a second dielectric structure 118 having a second plurality of metal interconnect layers 120. In some embodiments, the photodiodes may comprise p-n junctions that are operable coupled to memory node (i.e., a doped region within the second semiconductor substrate 114) by way of a transfer transistor (not shown).

In various embodiments, the first and second plurality of metal interconnect layers, 110 and 120, may comprise one or more conductive materials such as copper, aluminum, tungsten, or a combination thereof. In some embodiments, the first and second plurality of metal interconnect layers, 110 and 120, may comprise a plurality of metal wires 110b disposed between a plurality of contacts 110a and/or metal vias 110c. In some embodiments, the metal wires 110b, contacts 110a, and metal vias 110c may have angled sidewalls, which are angled to cause a width of the metal wires 110b, contacts 110a, and metal vias 110c to increase as a distance from the first semiconductor substrate 106 increases. In various embodiments, the first and second dielectric structures, 112 and 118, may have one or more dielectric layers comprising an oxide (e.g., silicon dioxide), an ultra-low k dielectric material, and/or a low-k dielectric material (e.g., SiCO).

The first integrated chip die 102 is vertically stacked onto the second integrated chip die 104 along a hybrid bonding interface region 202 comprising a bon pad 216, single-damascene conductive bonding structure 214, and a conductive blocking layer 136. In some embodiments, the hybrid bonding interface region 202 comprises a first etch stop layer (ESL) 204 disposed over the first dielectric structure 112 and a first passivation layer 206 disposed over the first ESL 204. In some embodiments, the first ESL 204 may comprise a nitride layer (e.g., silicon nitride). A second passivation layer 208 is arranged over the first passivation layer 206, and a third passivation layer 210 is arranged over the second passivation layer 208. In some embodiments, the first passivation layer 206, the second passivation layer 208, and the third passivation layer 210 may comprise a dielectric layer (e.g., an oxide, a polyimide, etc.). A second ESL 212 is arranged between the third passivation layer 210 and the second dielectric structure 118.

The bond pad 216 extends through the first ESL 204 and the first passivation layer 206 to couple to the first plurality of metal interconnect layers 110 at a first location. In some embodiments, shown in the cross-sectional view of FIG. 2A, the bond pad 216 is electrically coupled to a top metal interconnect wire (i.e., a metal interconnect wire within the first dielectric structure 112 that is furthest from the first semiconductor substrate 106). In other embodiments, shown in cross-sectional view 224 of FIG. 2B, the bond pad 226 is electrically coupled to an intermediate metal interconnect wire below the top metal interconnect wire. A bond pad opening 222 extends through the second integrated chip die 104 and the hybrid bonding interface region 202 to an upper surface of the bond pad 216. In some embodiments, the opening 222 has an upper portion lined with one or more passivation layers, 218 and 220. In some embodiments, the one or more passivation layers, 218 and 220, may comprise an oxide and/or a nitride, for example.

In some embodiments, the bond pad 216 may comprise a conductive metal such as aluminum, for example. In other embodiments, the bond pad 216 may comprise an under-bump metallurgy (UBM) layer comprising a stack of different metal layers serving as a diffusion layer, a barrier layer, a wetting layer, and/or an anti-oxidation layer. A conductive bump 132 is arranged on the bond pad 216. In some embodiments, the conductive bump 132 is a solder bump, a copper bump, a metal bump including nickel (Ni) or gold (Au), or combinations thereof.

The single-damascene conductive bonding structure 214 extends through the hybrid bonding interface region 202 to electrically couple the first plurality of metal interconnect layers 110 to the second plurality of metal interconnect layers 120. The single-damascene conductive bonding structure 214 has a first single-damascene bonding structure 214a comprising sidewalls with a substantially constant angle, which extend through the first ESL 204, the first passivation layer 206, and the second passivation layer 208 at a second location laterally offset from the first location. The single-damascene conductive bonding structure 214 further comprises a second single-damascene conductive bonding structure 214b having sidewalls with a substantially constant angle, which extend through the second ESL 212 and the third passivation layer 210. In some embodiments, the single-damascene conductive bonding structure 214 is electrically coupled to top metal interconnect wires. In various embodiments, the single-damascene conductive bonding structure 214 may comprise a conductive metal such as copper, for example.

The conductive blocking structure 136 is arranged within the hybrid bonding interface region 202 between the one or more semiconductor devices 108 and the array of image sensing elements 116. The conductive blocking structure 136 is separated from the first semiconductor substrate 106 by a first distance $d_1$ that is greater than or equal to a second distance $d_2$ between the first semiconductor substrate 106 and a bottom surface of the bond pad 216. In some embodiments, the conductive blocking structure 136 may be arranged between the first passivation layer 206 and the second passivation layer 208. In some embodiments, the conductive blocking structure 136 may have angled sidewalls 136s, which are angled to cause a width of the conductive blocking structure 136 to decrease as a distance from the first dielectric structure 112 increases. This gives the conductive bonding structure 136 sidewalls that are angled opposite the sidewalls of a top metal interconnect wire within the first plurality of metal interconnect layers 110 and the first single-damascene conductive bonding structure 214a.

In some embodiments, the conductive blocking structure 136 extends through an opening in the first ESL 204 and first passivation layer 206 to electrically couple to the first plurality of metal interconnect layers 110 at a third location laterally offset from the first and second locations. In such embodiments, heat generated by radiation from the one or more semiconductor devices 108 can be transferred away from the array of image sensing elements 116 to reduce a thermal impact of the radiation on the array of image sensing elements 116. In some embodiments, the conductive blocking structure 136 may be electrically coupled to a grounded metal wire within the first plurality of metal interconnect layers 110.

In various embodiments, the conductive blocking structure 136 may comprise a metal, such as aluminum, copper, and/or tungsten, for example. In some embodiments, the conductive blocking structure 136 has a first height $h_1$. The first height $h_1$ has a thickness that is sufficient to block radiation from the one or more semiconductor device 108 from reaching the array of image sensing elements 116. For example, in some embodiments, wherein the conductive blocking structure 136 comprises aluminum, the first height $h_1$ may be in a range of between approximately 100 nm and approximately 200 nm. In other embodiments, wherein the conductive blocking structure 136 comprises a different material, the first height $h_1$ may be greater than or equal to approximately 200 nm. In some embodiments, as shown in the cross-sectional view of FIG. 2A the first height $h_1$ of the conductive blocking structure 136 may be less than or equal to a second height $h_2$ of the bond pad 216. In other embodiments, as shown in cross-sectional view 224 of FIG. 2B, the bond pad 226 has a second height $h_2'$ that is greater than a first height $h_1$ of the conductive blocking structure 136.

Figure 3:
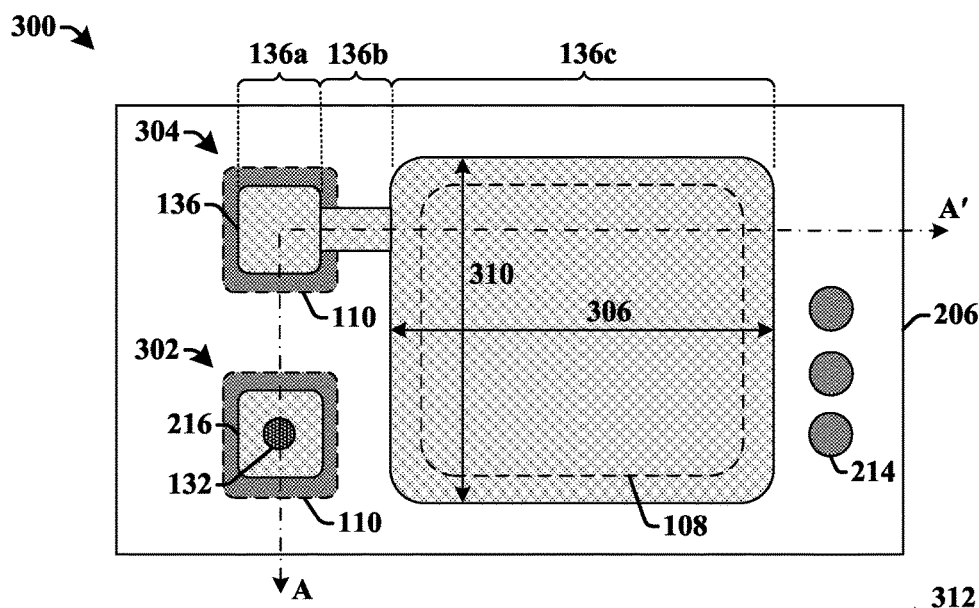
FIG. 3 illustrates a top-view of some embodiments of corresponding to the stacked IC structure of FIG. 2A or 2B.

FIG. 3 illustrates some embodiments of a top-view 300 corresponding to the stacked IC structure of FIG. 2A or 2B (FIG. 2A shown along line A-A' of FIG. 3).

As shown in top-view 300, a bond pad 216 is arranged within a first opening 302 in the first passivation layer (e.g., 208 of FIG. 2A) and the first ESL (e.g., 206 of FIG. 2A). The bond pad 216 extends to an underlying one of the first plurality of metal interconnect layers 110. A conductive bump 132 is arranged onto the bond pad 216. One or more single-damascene conductive bonding structures 214 extend through the first passivation layer and the first ESL at a location that is offset from the bond pad 216.

A conductive blocking structure 136 extends from a second opening 304 in the first passivation layer and the first ESL to a blocking region 136c that is laterally offset from the second opening 304. In some embodiments, the conductive blocking structure 136 comprises a first region 136a within the second opening 304 that is coupled to the blocking region 136c by way of a connection region 136b having a width that is less than a width of the second opening 304.

The blocking region 136c has a length 306 extending in a first direction 308 and a width 310 extending in the second direction 312. The length 306 and width 310 of the blocking region 136c are greater than a length and width of the first opening 302 and/or the second opening 304. In some embodiments, the width of the blocking region 136c is greater than a width of underlying metal interconnect wires within the first plurality of metal interconnect layers. Because the width of the blocking region 136c is greater than a width of underlying metal interconnect wires, the blocking region 136c is able to block radiation that the metal interconnect wires are not able to block. In some embodiments, the blocking region 136c extends past the one or more semiconductor devices 108 and/or the array of image sensing elements (not shown) in the first direction 308 and in the second direction 312. This causes the blocking region 136c to cover the one or more semiconductor devices 108, thereby blocking propagation of radiation produced by operation of the one or more semiconductor devices 108 from reaching the array of image sensing elements.

Figure 4A:
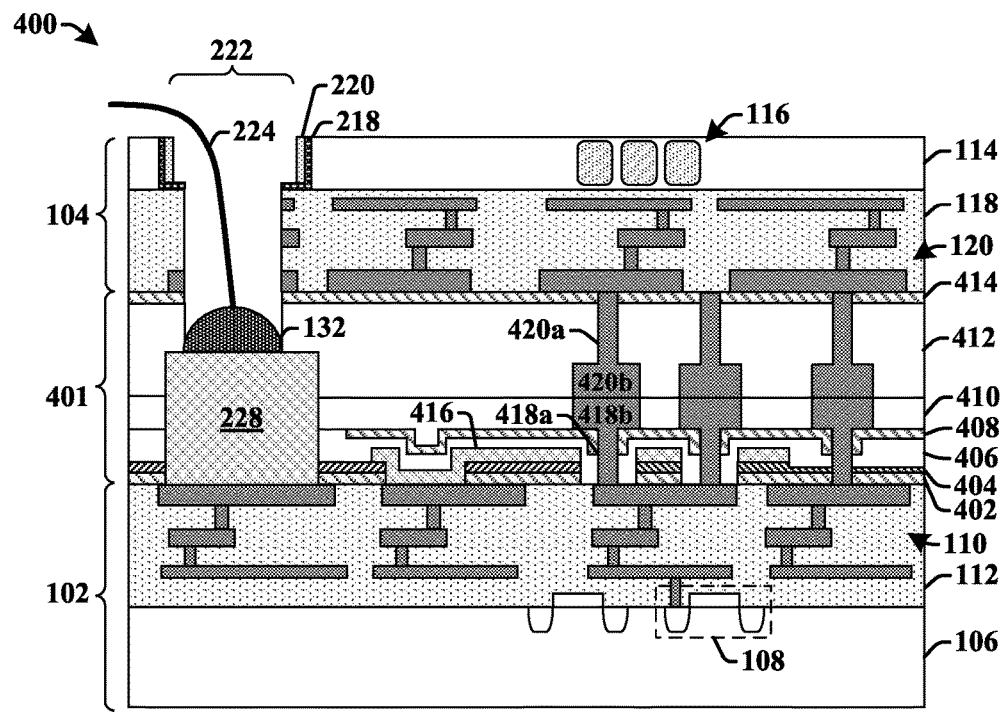
FIGS. 4A-4B illustrates some embodiments of a stacked IC structure comprising a conductive blocking structure arranged between die electrically coupled by dual-damascene conductive bonding structures.
Figure 4B:
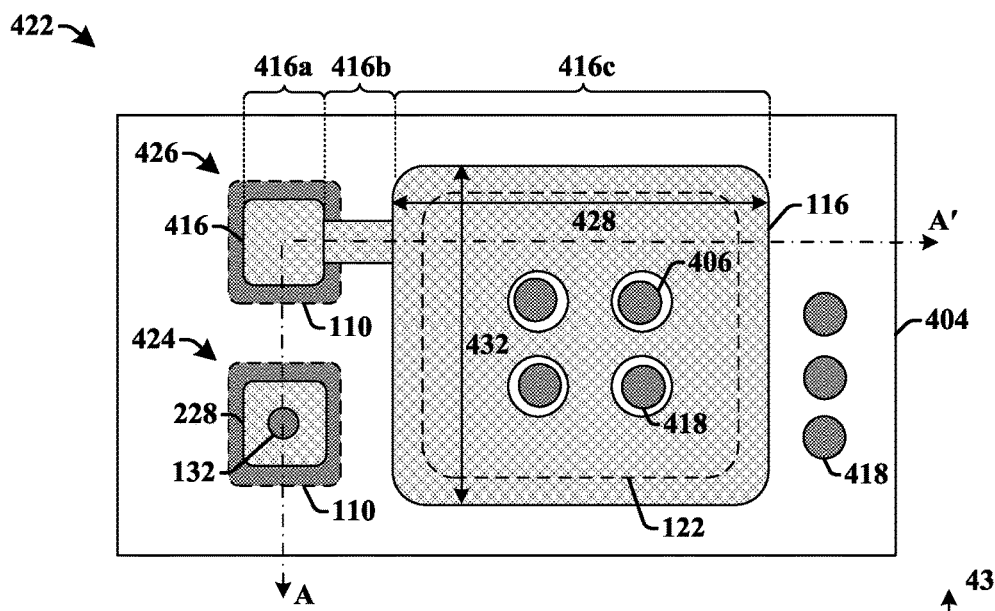

FIGS. 4A-4B illustrates some embodiments of a stacked IC structure comprising a conductive blocking structure arranged between die electrically coupled by dual-damascene conductive bonding structures.

The stacked IC structure 400 comprises a first integrated chip die 102 stacked onto a second integrated chip die 104 along a hybrid bonding interface region 401. The first integrated chip die 102 comprises a first semiconductor substrate 106 having one or more semiconductor devices 108, and a first dielectric structure 112 having a first plurality of metal interconnect layers 110. The second integrated chip die 104 comprises a second semiconductor substrate 114 having an array of image sensing elements 116, and a second dielectric structure 118 having a second plurality of metal interconnect layers 120.

In some embodiments, the hybrid bonding interface region 401 comprises a first etch stop layer (ESL) 402 disposed over the first dielectric structure 112 and a first passivation layer 404 disposed over the first ESL layer 402. A second passivation layer 406 is arranged over the first passivation layer 404, and a second ESL 408 is arranged over the second passivation layer 406. A third passivation layer 410 is arranged over the second ESL 408. A fourth passivation layer 412 is arranged over the third passivation layer 410 and a third ESL 414 is arranged between the fourth passivation layer 412 and the second dielectric structure 118. In some embodiments, the first passivation layer 404, the second passivation layer 406, the third passivation layer 410, and the fourth passivation layer 412 may comprise an oxide and/or a polyimide, while the first ESL 402, the second ESL 408, and the third ESL 414 may comprise a nitride.

A bond pad 228 is arranged within the hybrid bonding interface region 401. The bond pad 228 is coupled to the first plurality of metal interconnect layers 110 at a first location. A bond pad opening 222 extends through the second integrated chip die 104 and the hybrid bonding interface region 401 to the bond pad 228.

A conductive blocking structure 416 is arranged within the hybrid bonding interface region 401 at a location between the one or more semiconductor devices 108 and the array of image sensing elements 116. In some embodiments, the conductive blocking structure 136 may be arranged between the first passivation layer 404 and the second passivation layer 406. In some embodiments, the conductive blocking structure 416 extends through openings in the first ESL 402 and the first passivation layer 404 to electrically couple to the first plurality of metal interconnect layers 110.

Dual-damascene conductive bonding structures extend through the hybrid bonding interface region 401 to electrically couple the first plurality of metal interconnect layers 110 to the second plurality of metal interconnect layers 120. In some embodiments, the dual-damascene conductive bonding structures may extend through openings in the conductive blocking layer 416. The dual-damascene conductive bonding structures have first and second conductive bonding structures with stepped sidewalls. A first dual-damascene conductive bonding structure comprises a via segment 418a and a wire segment 418b that protrudes outward from sidewalls of the via segment 418a. A second dual-damascene conductive bonding structure comprises a via segment 420a and a wire segment 420b that protrudes outward from sidewalls of the via segment 420a. In some embodiments, the via segments, 418a and 418b, may have widths in a range of between approximately 200 nm and approximately 500 nm, and the wire segments, 420a and 420b, may have widths in a range of between approximately 1000 nm and approximately 2500 nm. In some embodiments (not shown), the wire segments, 420a and 420b, may be vertically and laterally separated from the second ESL 408 by the third passivation layer 410.

FIG. 4B illustrates some embodiments of a top-view 422 corresponding to the stacked IC structures of FIG. 4A (FIG. 4A shown along line A-A' of FIG. 4B).

As shown in top-view 422, the bond pad 228 is arranged within a first opening 424 in the first passivation layer (e.g., 208 of FIG. 4A) and the first ESL (e.g., 402 of FIG. 4A). The bond pad 228 extends to an underlying one of the first plurality of metal interconnect layers 110. A conductive bump 132 is arranged onto the bond pad 216.

A conductive blocking structure 416 extends from a second opening 426 in the first passivation layer and the first ESL to a blocking region 416c that is laterally offset from the second opening 426. In some embodiments, the conductive blocking structure 416 comprises a first region 416a within the second opening 426 that is coupled to the blocking region 416c by way of a connection region 416b having a width that is less than a width of the second opening 426. The blocking region 416c has a length 428 (extending in a first direction 430) and a width 432 (extending in the second direction 434), which cause the blocking region 416c to extend past the one or more semiconductor devices 108 and/or the array of image sensing elements (not shown) in the first direction 430 and in the second direction 434.

One or more dual-damascene conductive bonding structures 418 extend through the first passivation layer and the first ESL at a location that is offset from the bond pad 228. In some embodiments, a first plurality of the dual-damascene conductive bonding structures 418 extend through the first passivation layer and the first ESL at a location offset from the blocking region 416c, while a second plurality of the dual-damascene conductive bonding structures 418 extend through the first passivation layer, the first ESL, and the blocking region 416c.

FIGS. 5-13 illustrate some embodiments of cross-sectional views 500-1300 showing a method of forming a stacked IC structure comprising a conductive blocking structure arranged between die electrically coupled by a single-damascene bonding structure.

As shown in cross-sectional view 500, a plurality of semiconductor devices 108 are formed within a first semiconductor substrate 106. As described herein, a semiconductor substrate may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate may comprise an intrinsically doped semiconductor substrate having a first doping type (e.g., an n-type doping or a p-type doping).

In some embodiments, the plurality of semiconductor devices 108 are formed by forming a gate dielectric layer onto the first semiconductor substrate 106, and subsequently forming a gate electrode layer over the gate dielectric layer. The gate dielectric layer and the gate electrode layer are subsequently patterned according to a photolithography process to form a gate structure. Source and drain regions may be formed by an epitaxial process or by an implantation process that selectively implants the first semiconductor substrate 106 with a dopant species, such as boron (B) or phosphorous (P), for example. The dopant species may be subsequently driven into the first semiconductor substrate 106 by a high temperature thermal anneal.

As shown in cross-sectional view 600, a first plurality of metal interconnect layers 110 are formed within a first dielectric structure 112 formed over the first semiconductor substrate 106. In some embodiments, the first plurality of metal interconnect layers 110 may comprise metal interconnect wires arranged between metal contacts and/or vias. In some embodiments, the first dielectric structure 112 comprises a plurality of stacked dielectric layers 112a-112d.

In some embodiments, the plurality of stacked dielectric layer 112a-112d are formed using separate deposition processes. Via holes and/or metal trenches are etched into one of the plurality of stacked dielectric layers 112a-112d after its deposition. A conductive material (e.g., copper, tungsten, and/or aluminum) is deposited within the via holes and/or metal trenches to form the first plurality of metal interconnect layers 110. In some embodiments, a deposition process may be used to form a seed layer within the via holes, followed by a subsequent plating process (e.g., an electroplating process, an electro-less plating process) that forms the metal material to a thickness that fills the via holes and/or metal trenches. In some embodiments, a chemical mechanical polishing (CMP) process may be used to remove excess of the metal material from a top surface of the plurality of stacked dielectric layers 112a-112d. In various embodiments, the plurality of metal interconnect layers may be formed by a dual-damascene process (shown) or a single-damascene process (not shown).

As shown in cross-sectional view 700, a first etch stop layer 702 and a first passivation layer 704 are formed over the first dielectric structure 112. In some embodiments, the first etch stop layer 702 may comprise a nitride layer formed by a deposition process (e.g., CVD, PE-CVD, ALD, PVD, etc.). In some embodiments, the first passivation layer 704 may comprise an oxide layer formed by a deposition process.

FIGS. 8A-8B show cross-sectional views of various embodiments of forming a bond pad and conductive blocking structure.

As shown in cross-sectional view 800, a first opening 802 and a second opening 804 are formed through the first etch stop layer 806 and the first passivation layer 808 to positions contacting one of the first plurality of metal interconnect layers 110. In some embodiments, the first opening 802 and a second opening 804 may be formed by selectively exposing the substrate to an etchant 810 according to a masking layer (not shown). In various embodiments, the masking layer may comprise photoresist or a nitride (e.g., $Si_3N_4$, SiN) patterned using a photolithography process. In various embodiments, the etchant 810 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

As shown in cross-sectional view 812, a bond pad 216 is formed within the first opening 802 and a conductive blocking structure 136 is formed within the second opening 804. The bond pad 216 and the conductive blocking structure 136 extend from within the openings, 802 and 804, to over the first passivation layer 808. In some embodiments, the bond pad 216 and conductive blocking structure 136 may comprise aluminum. In other embodiments, the bond pad 216 and conductive blocking structure 136 may comprise copper, tungsten, or a similar material. In some embodiments, the bond pad 216 and conductive blocking structure 136 may be formed by way of a single deposition process and/or a single plating process.

As shown in cross-sectional view 814, a bond pad 228 is formed within a first opening extending through the first etch stop layer 806' and the first passivation layer 808' to a position contacting one of the plurality of first metal interconnect layers 110. In some embodiments, the bond pad 228 may be formed by way of a first etch process followed by a first deposition process and/or a first plating process.

As shown in cross-sectional view 816, a conductive blocking structure 136 is formed within a second opening extending through the first etch stop layer 806 and the first passivation layer 808 to a position contacting one of the first plurality of metal interconnect layers 110. In some embodiments, the conductive blocking structure 136 may be formed by way of a second etch process followed by a second deposition process and/or a second plating process.

As shown in cross-section view 900, a second passivation layer 902 is formed over the bond pad 216 and the conductive blocking structure 136. In some embodiments, the second passivation layer 902 may comprise a dielectric material (e.g., an oxide) formed by way of a deposition process. A first hard mask layer 904 may be formed over the second passivation layer 902. In some embodiments, the first hard mask layer 904 may comprise a silicon oxy-nitride layer formed by way of a deposition process.

As shown in cross-section view 1000, a first single-damascene bonding structure 214a is formed. The first single-damascene bonding structure 214a may be formed by exposing the substrate to an etchant to form an opening extending through the first etch stop layer 204, the first passivation layer 206, the second passivation layer 1002, and the first hard mask layer 1004. In some embodiments, the opening may have an angled sidewall causing a width of the opening to decrease as a distance from the first semiconductor substrate 106 decreases. Conductive material is subsequently deposited within the opening. In some embodiments, a planarization process may be performed after depositing the conductive material to remove excess conductive material from over the first hard mask layer 1004 and to form the first single-damascene bonding structure 214a. In some embodiments, the conductive material may comprise copper.

As shown in cross-section view 1100, a second integrated chip die 104 is bonded to the first integrated chip die 102 along a hybrid bonding interface region 1102. The second integrated chip die 104 comprises a second semiconductor substrate 114 having an array of image sensing elements 116 (e.g., photodiodes). A second plurality of metal interconnect layers 120 are arranged within a second dielectric structure 118 comprising one or more stacked dielectric layer arranged over the second semiconductor substrate 114. A second etch stop layer 1108, a third passivation layer 1106, and a second hard mask layer 1104 may be arranged between the second semiconductor substrate 114 and the first hard mask layer 1004.

In some embodiments, the second integrated chip die 104 may be may be bonded to the first integrated chip die 102 through a hybrid bonding process. In some embodiments, the hybrid bonding process comprises a fusion bonding process between the first hard mask layer 904 and the second hard mask layer 1104, and a bonding process between the first single-damascene bonding structure 214a and a second single-damascene conductive bonding structure 214b. In some embodiments, the second single-damascene conductive bonding structure 214b may have a sidewall angled at an opposite angle of the first single-damascene conductive bonding structure 214a.

As shown in cross-section view 1200, a bond pad opening 130 is formed through the second integrated chip die 104 to expose the bond pad 228. In some embodiments, the bond pad opening 130 may be formed by selectively exposing a back-side 114b of the second semiconductor substrate 114 to an etchant 1202 (e.g., HF, KOH, TMAH, etc.) according to a masking layer (not shown).

In some embodiments, a thickness of the second semiconductor substrate 114 is reduced prior to forming the bond pad opening 130. The second semiconductor substrate 114 may be thinned by an etching process and/or by mechanically grinding the back-side 114b of the second semiconductor substrate 114. In some embodiments, the substrate thickness is reduced from a first thickness of approximately 700 um to a second thickness in a range of between approximately 1 um and 10 um.

As shown in cross-sectional view 1300, a conductive bump 132 is formed on the bond pad 228. In various embodiments, the conductive bump 132 may comprise a solder bump, a copper bump, a metal bump including nickel (Ni) or gold (Au), or combinations thereof. In some embodiments, the solder bump includes a lead-free pre-solder layer, SnAg, or a solder material including alloys of tin, lead, silver, copper, nickel, bismuth, or combinations thereof. In some embodiments, the conductive bump 132 is a solder bump formed by placing a solder ball on the bond pad 228 and then re-flowing the solder ball.

Figure 13:
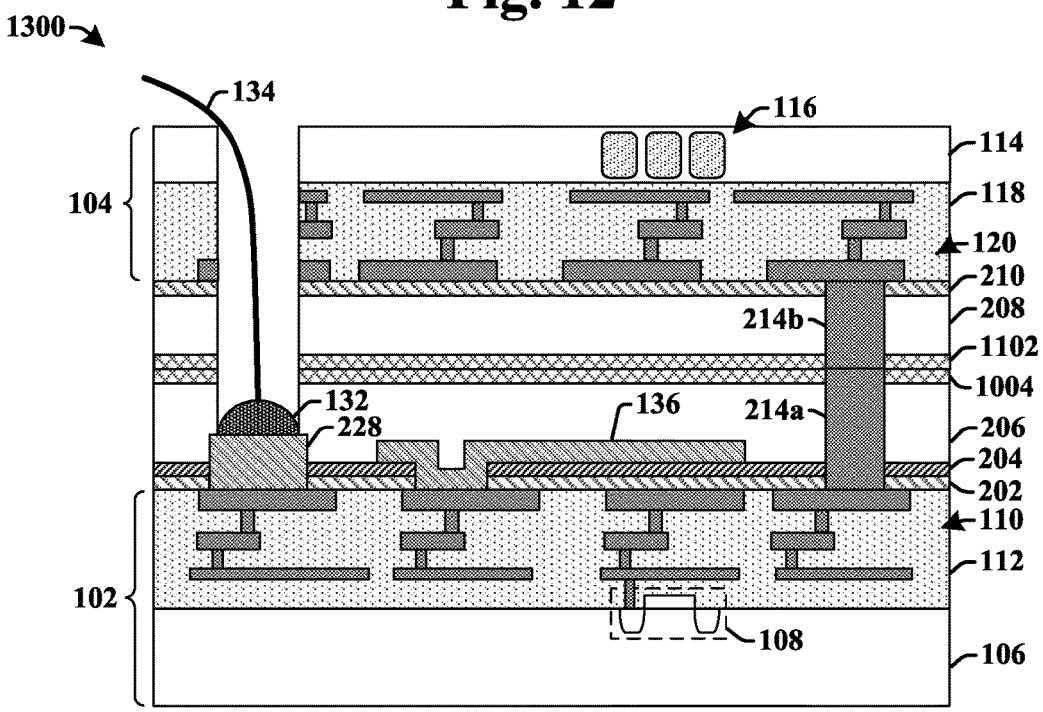
Figure 14:
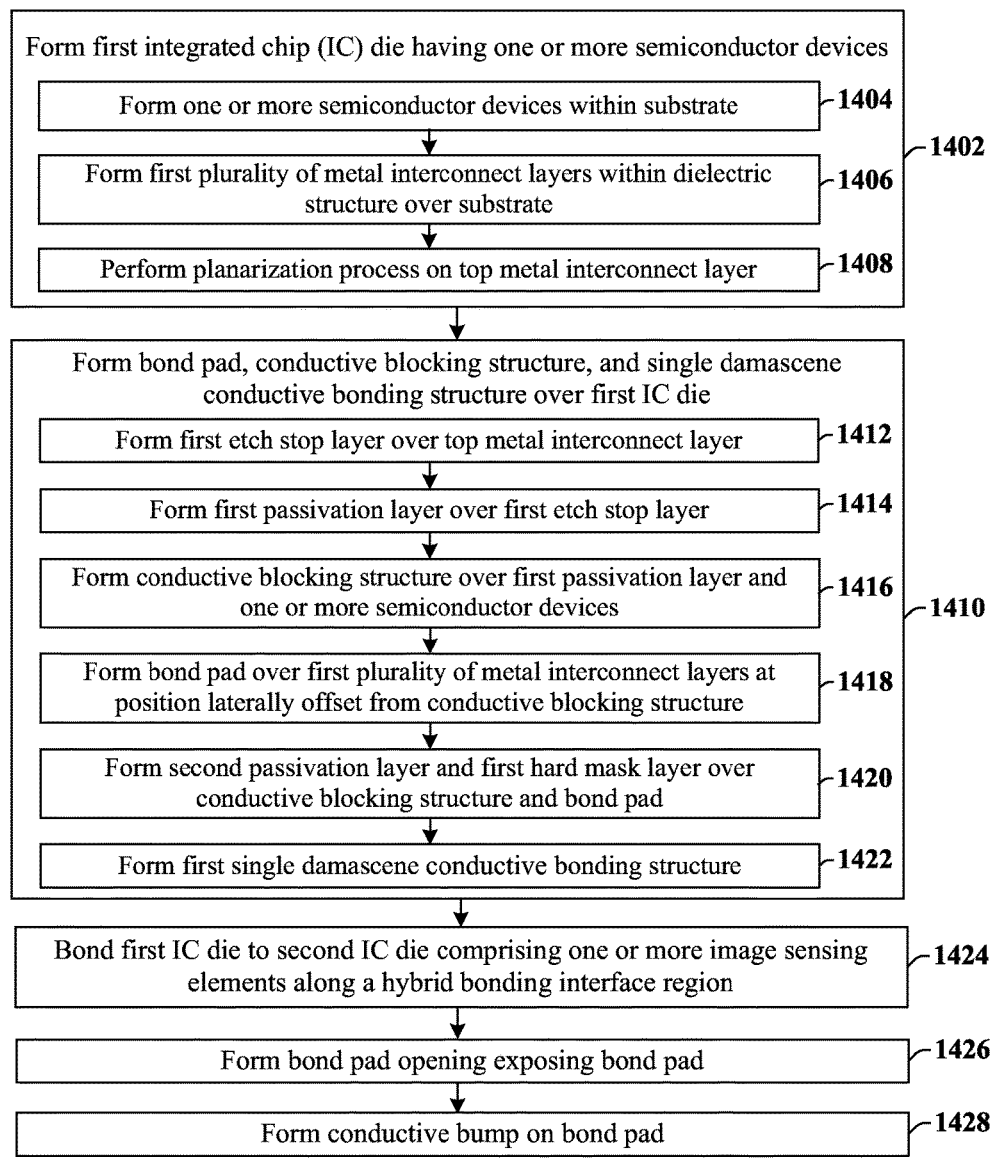
FIG. 14 illustrates a flow diagram of some embodiments of a method of forming a stacked IC structure comprising a conductive blocking structure arranged between die electrically coupled by a single-damascene conductive bonding structure.

FIG. 14 illustrates a flow diagram of some embodiments of a method 1400 of forming a stacked IC structure comprising a conductive blocking structure arranged between die electrically coupled by a single-damascene bonding structure. Although method 1400 is described in relation to FIGS. 5-13, it will be appreciated that the method 1400 is not limited to such structures, but instead may stand alone as a method independent of the structures.

Furthermore, while the disclosed methods (e.g., methods 1400 and 2400) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a first integrated chip die having one or more semiconductor devices (e.g., transistor devices) is formed. In some embodiments, act 1402 may be performed according to acts 1404-1408.

Figure 5:
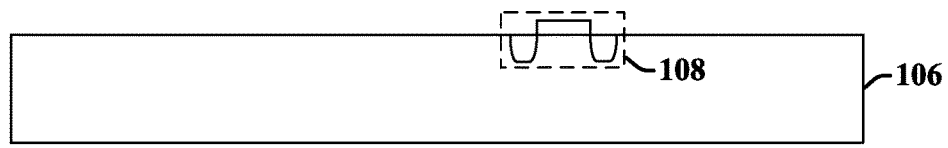

At 1404, one or more semiconductor devices are formed within a substrate. FIG. 5 illustrates a cross-sectional view corresponding to some embodiments of act 1404.

Figure 6:
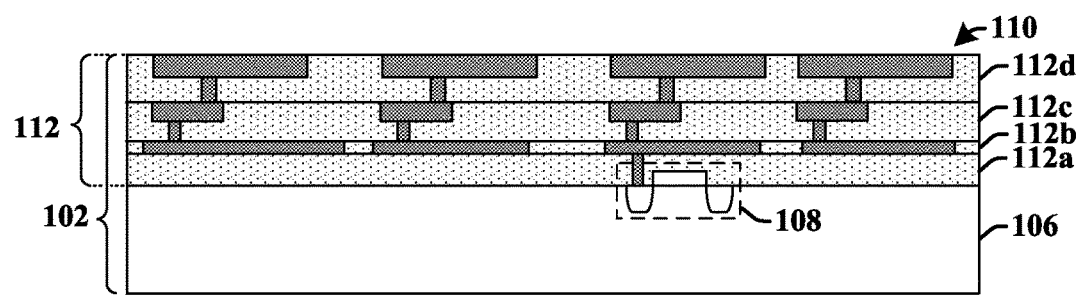

At 1406, a plurality of metal interconnect layers are formed within a dielectric structure over the substrate. FIG. 6 illustrates a cross-sectional view corresponding to some embodiments of act 1406.

At 1408, a planarization process is performed on a top metal interconnect layer. FIG. 6 illustrates a cross-sectional view corresponding to some embodiments of act 1408.

At 1410, a bond pad, a conductive blocking structure, and a first single-damascene conductive bonding structure are formed over the first integrated chip die. In some embodiments, act 1410 may be performed according to acts 1412-1422.

Figure 7:
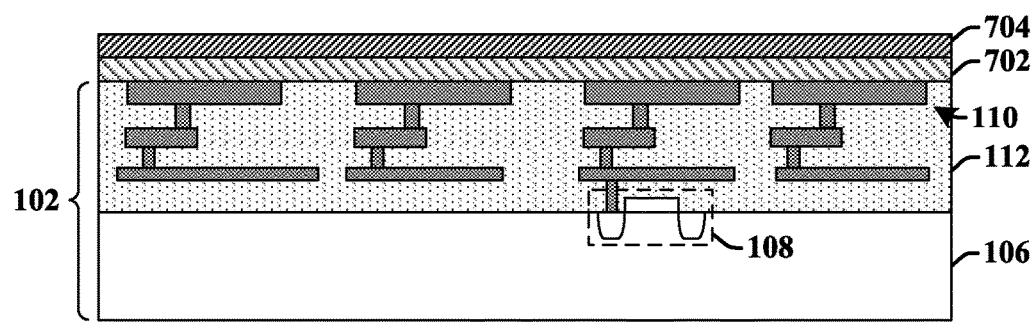

At 1412, a first etch stop layer is formed over the top metal interconnect layer. FIG. 7 illustrates a cross-sectional view corresponding to some embodiments of act 1412.

At 1414, a first passivation layer is formed over the first etch stop layer. FIG. 7 illustrates a cross-sectional view corresponding to some embodiments of act 1414.

At 1416, a conductive blocking structure is formed over the first passivation layer and over the one or more semiconductor devices. The conductive blocking structure extends past the one or more semiconductor devices in a first direction and in a second direction perpendicular to the first direction. FIGS. 8A-8B illustrate cross-sectional views corresponding to some embodiments of act 1416.

At 1418, a bond pad is formed over the first plurality of metal interconnect layers. FIGS. 8A-8B illustrate cross-sectional views corresponding to some embodiments of act 1418.

At 1420, a second passivation layer and a first hard mask layer are formed over the conductive blocking structure and the bond pad. FIG. 9 illustrates a cross-sectional view corresponding to some embodiments of act 1420.

Figure 10:
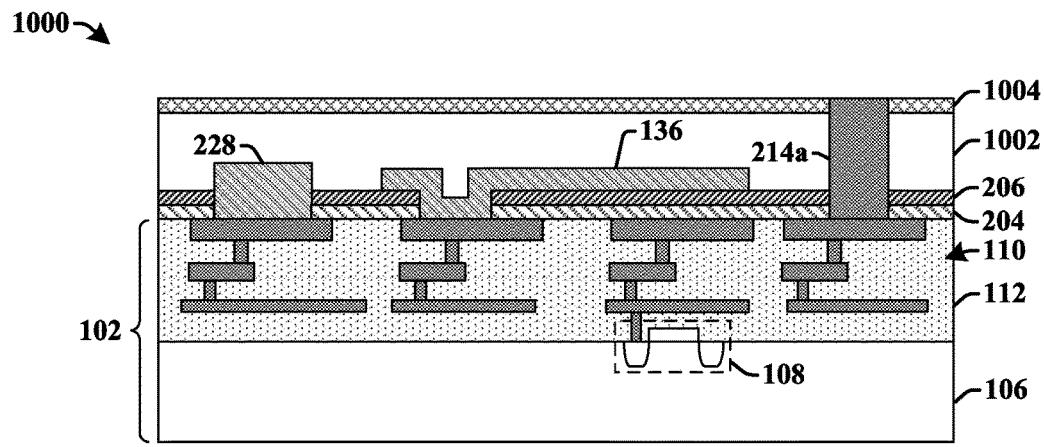

At 1422, a first single-damascene conductive bonding structure is formed. The first single-damascene conductive bonding structure extends through the first passivation layer, the second passivation layer, and the first etch stop layer. FIG. 10 illustrates a cross-sectional view corresponding to some embodiments of act 1422.

Figure 11:
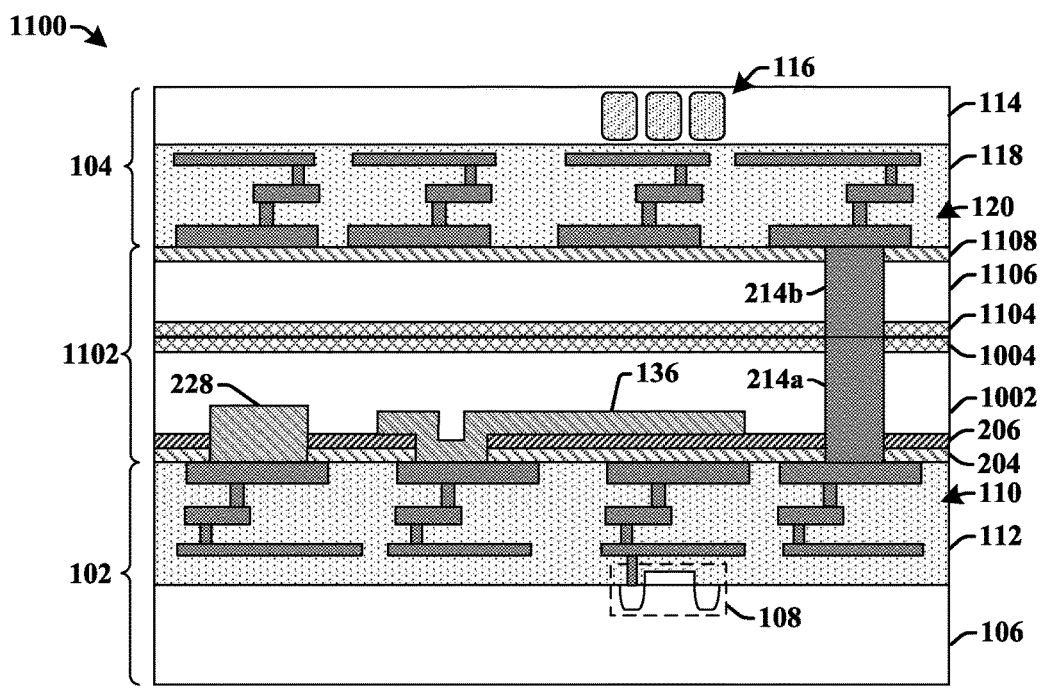

At 1424, the first integrated chip die is bonded to a second integrated chip die comprising an array of image sensing elements along a hybrid bonding interface region. FIG. 11 illustrates a cross-sectional view corresponding to some embodiments of act 1424.

Figure 12:
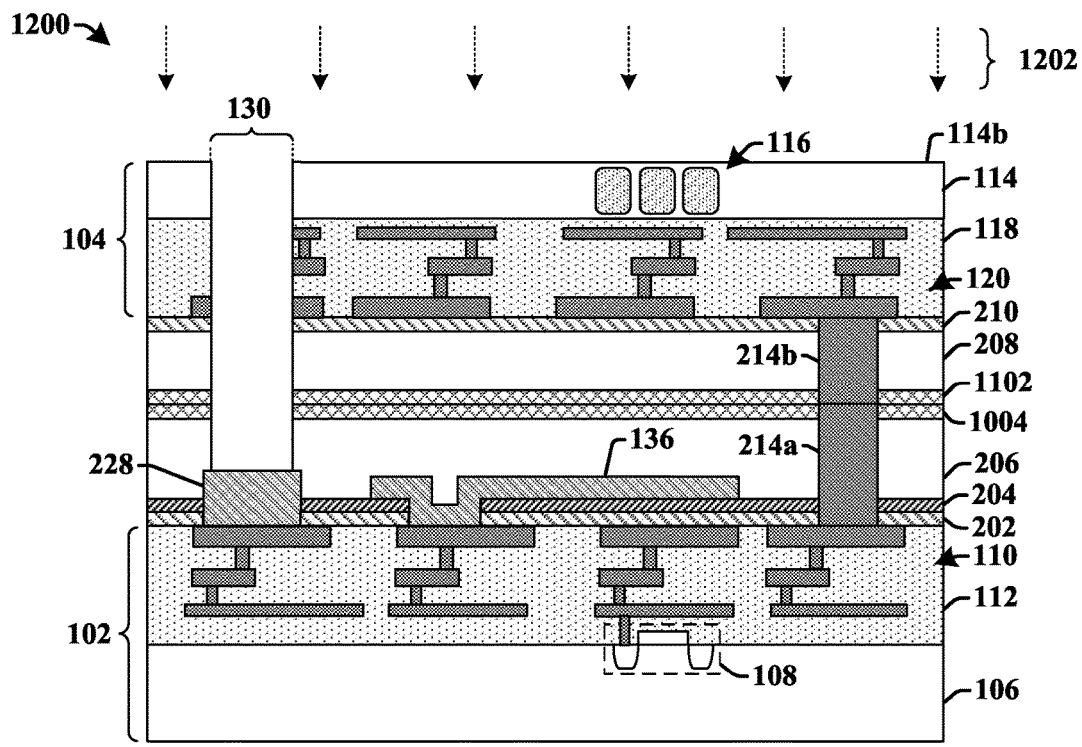

At 1426, a bond pad opening is formed to extend through the second integrated chip die and parts of the hybrid bonding interface region to the bond pad. FIG. 12 illustrates a cross-sectional view corresponding to some embodiments of act 1426.

At 1428, a conductive bump is formed on the bond pad. FIG. 13 illustrates a cross-sectional view corresponding to some embodiments of act 1428.

FIGS. 15-22 illustrate some embodiments of cross-sectional views showing a method of forming a stacked IC structure comprising a conductive blocking structure arranged between die electrically coupled by a dual-damascene bonding structure.

As shown in cross-sectional view 1500, a plurality of semiconductor devices 108 are formed within a first semiconductor substrate 106. In some embodiments, the plurality of semiconductor devices 108 are formed as described above in relation to cross-sectional view 500.

As shown in cross-sectional view 1600, a first plurality of metal interconnect layers 110 are formed within a first dielectric structure 112 formed over the first semiconductor substrate 106. In some embodiments, the first plurality of metal interconnect layers 110 and the first dielectric structure 112 are formed as described above in relation to cross-sectional view 600.

As shown in cross-sectional view 1700, a first etch stop layer 702 and a first passivation layer 704 are formed over the first dielectric structure 112. In some embodiments, the first etch stop layer 702 and the first passivation layer 704 are formed as described above in relation to cross-sectional view 700.

FIGS. 18A-18B show cross-sectional views of various embodiments of forming a bond pad and conductive blocking structure.

As shown in cross-sectional view 1800, a first opening 802 and a second opening 804 are formed through the first etch stop layer 806 and the first passivation layer 808 to positions contacting one of the first plurality of metal interconnect layers 110.

As shown in cross-sectional view 1802, a bond pad 216 is formed within the first opening 802 and a conductive blocking structure 136 is formed within the second opening 804. In some embodiments, the bond pad 216 and conductive blocking structure 136 may be formed by way of a single deposition process and/or a single plating process. The bond pad 216 and the conductive blocking structure 136 extend from within the openings, 802 and 804, to over the first passivation layer 808. A second passivation layer 1804 is formed over the first passivation layer 808 and a second etch stop layer 1806 is formed over the second passivation layer 1804.

As shown in cross-sectional view 1808, a bond pad 228 is formed within a first opening extending through the first etch stop layer 806' and the first passivation layer 808' to a position contacting one of the first plurality of metal interconnect layers 110.

As shown in cross-sectional view 1810, a conductive blocking structure 136 is formed within a second opening extending through the first etch stop layer 806 and the first passivation layer 808 to a position contacting one of the first plurality of metal interconnect layers 110. A second passivation layer 1804 is formed over the first passivation layer 808 and a second etch stop layer 1806 is formed over the second passivation layer 1804.

As shown in cross-section view 1900, a third passivation layer 1902 (e.g., a dielectric layer) is formed over the bond pad 228 and the conductive blocking structure 136. A first hard mask layer 904 may be formed over the third passivation layer 1902. In some embodiments, the third passivation layer 1902 and the first hard mask layer 904 may be formed by deposition processes.

As shown in cross-section view 2000, a first dual-damascene conductive bonding structure comprising a via segment 418a and a wire segment 418b is formed. The first dual-damascene conductive bonding structure may be formed by exposing the substrate to a first etchant (according to a first masking layer) to form an via hole extending through the first etch stop layer 402, the first passivation layer 404, the second passivation layer 2002, and to subsequently expose the substrate to a second etchant (according to a second masking layer) to form a trench extending through the second etch stop layer 2004, the third passivation layer 2006 and the first hard mask layer 2008. Conductive material is subsequently deposited within the via hole and trench. In some embodiments, a planarization process may be performed after depositing the conductive material to remove excess conductive material from over the first hard mask layer 2008 and to form the first dual-damascene conductive bonding structure. In some embodiments, the conductive material may comprise copper.

As shown in cross-section view 2100, a second integrated chip die 104 is bonded to the first integrated chip die 102 along a hybrid bonding interface region 2102. The second integrated chip die 104 comprises a second semiconductor substrate 114 having an array of image sensing elements 116 (e.g., photodiodes). A second plurality of metal interconnect layers 120 are arranged within a second dielectric structure 118 comprising one or more dielectric materials arranged over the second semiconductor substrate 114. A second conductive bonding structure 2110 extends through a third etch stop layer 2108, a third passivation layer 2106, and a second hard mask layer 2104 arranged between the second semiconductor substrate 114 and the first hard mask layer 2008.

In some embodiments, the second integrated chip die 104 may be may be bonded to the first integrated chip die 102 through a hybrid bonding process. In some embodiments, the hybrid bonding process comprises a fusion bonding process between the first hard mask layer 2008 and the second hard mask layer 2104, and a bonding process between the first dual single-damascene conductive bonding structure 418 and the second conductive bonding structure 2110.

As shown in cross-section view 2200, a bond pad opening 222 is formed through the second integrated chip die 104 to expose the bond pad 228. In some embodiments, the bond pad opening 222 may be formed by selectively exposing a back-side 114b of the second semiconductor substrate 114 to an etchant 2202 according to a masking layer (not shown). In some embodiments, a thickness of the second semiconductor substrate 114 is reduced prior to forming the bond pad opening 222. In some embodiments, the bond pad opening 222 may be formed as described above in relation to cross-sectional view 1200.

As shown in cross-sectional view 2300, a conductive bump 132 is formed on the bond pad 228. In some embodiments, the conductive bump 132 may be formed as described above in relation to cross-sectional view 1300.

Figure 23:
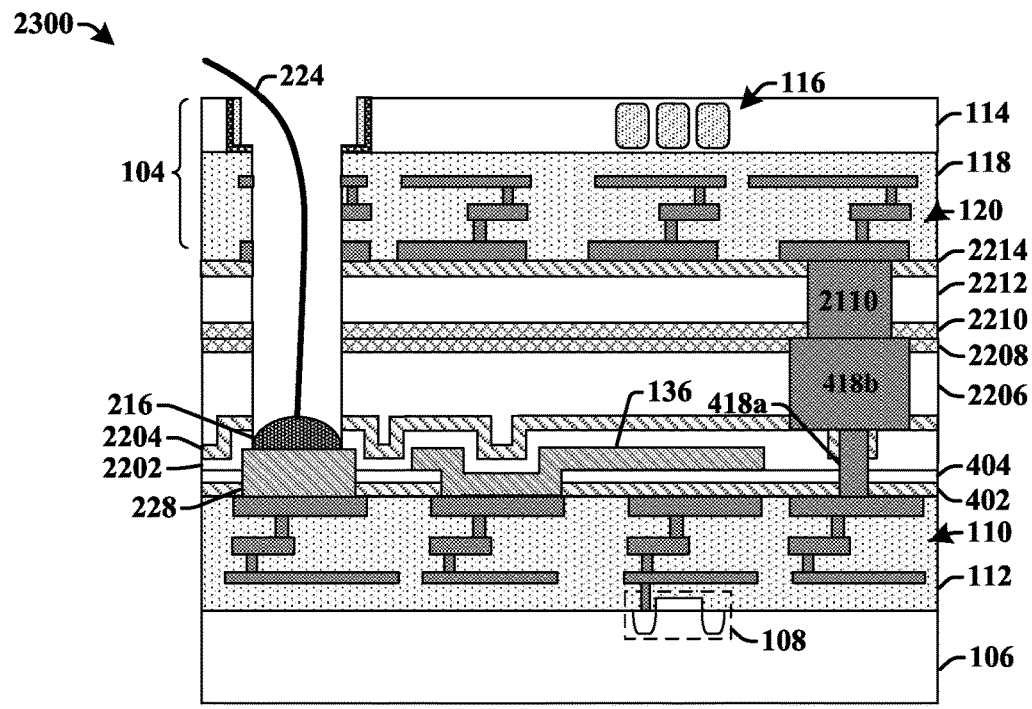
Figure 24:
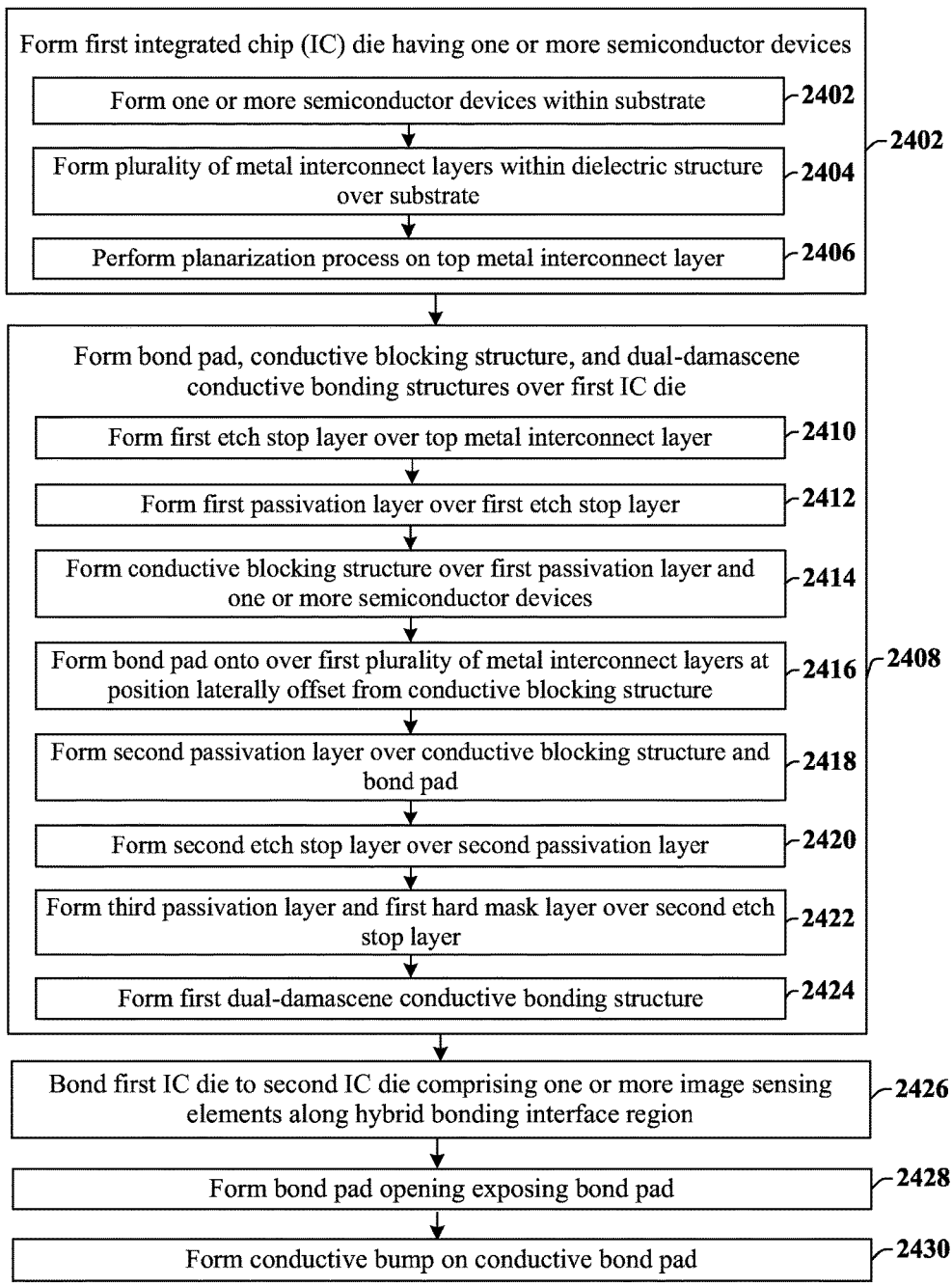
FIG. 24 illustrates a flow diagram of some embodiments of a method of forming a stacked IC structure comprising a conductive blocking structure arranged between die electrically coupled by a dual-damascene conductive bonding structure.

FIG. 24 illustrates a flow diagram of some embodiments of a method of forming a stacked IC structure comprising a conductive blocking structure arranged between die electrically coupled by a dual-damascene bonding structure. Although method 2400 is described in relation to FIGS. 15-23, it will be appreciated that the method 2400 is not limited to such structures, but instead may stand alone as a method independent of the structures.

At 2402, a first integrated chip die having one or more semiconductor die is formed. In some embodiments, act 2402 may be performed according to acts 2404-2408.

Figure 15:
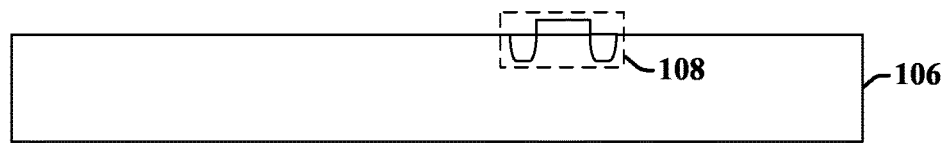

At 2404, one or more semiconductor devices are formed within a substrate. FIG. 15 illustrates a cross-sectional view corresponding to some embodiments of act 2404.

Figure 16:
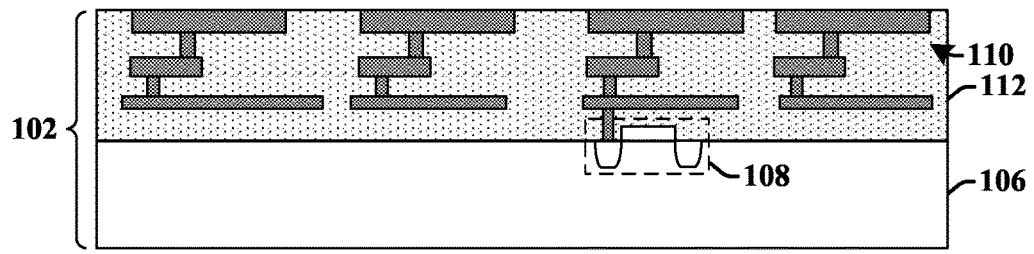

At 2406, a plurality of metal interconnect layers are formed within a first dielectric structure over the substrate. FIG. 16 illustrates a cross-sectional view corresponding to some embodiments of act 2406.

At 2408, a planarization process is performed on a top metal interconnect layer. FIG. 16 illustrates a cross-sectional view corresponding to some embodiments of act 2408.

At 2410, a conductive bond pad, a conductive blocking structure, and a first dual-damascene conductive bonding structure are formed over the first IC die. In some embodiments, act 2410 may be performed according to acts 2412-2422.

Figure 17:
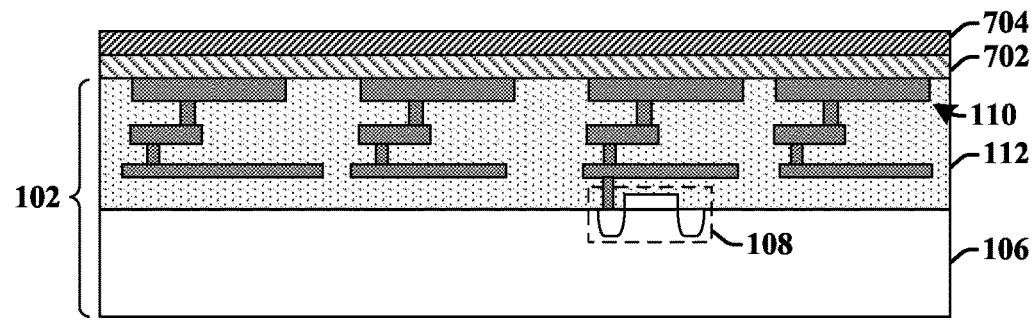
Figure 20:
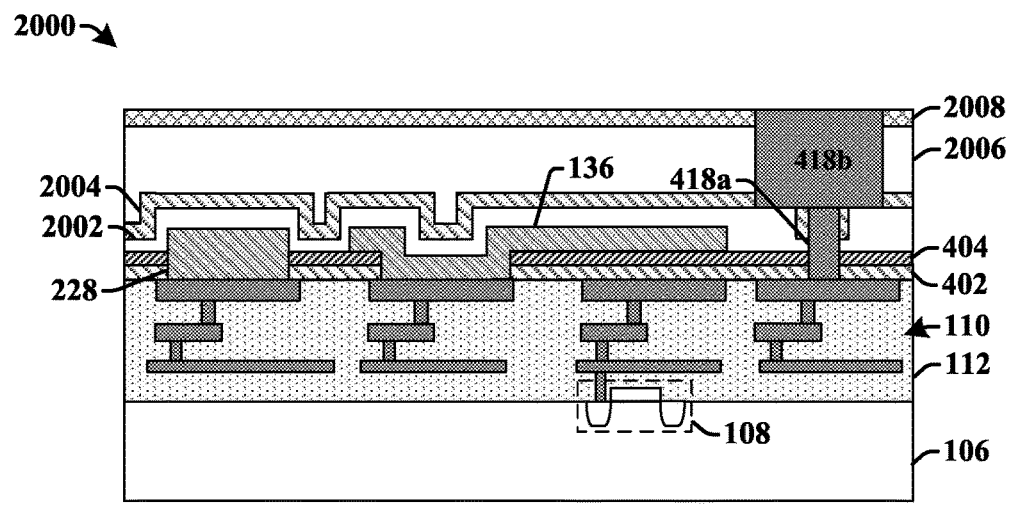

At 2412, a first etch stop layer is formed over the top metal interconnect layer. FIG. 17 illustrates a cross-sectional view corresponding to some embodiments of act 2412.

At 2414, a first passivation layer is formed over the first etch stop layer. FIG. 17 illustrates a cross-sectional view corresponding to some embodiments of act 2414.

At 2416, a conductive blocking structure is formed over the first passivation layer. The conductive blocking structure extends past the one or more semiconductor devices in a first direction and in a second direction perpendicular to the first direction. FIGS. 18A-18B illustrate cross-sectional views corresponding to some embodiments of act 2416.

At 2418, a bond pad is formed over the first passivation layer. FIGS. 18A-18B illustrate cross-sectional views corresponding to some embodiments of act 2418.

At 2420, a second passivation layer is formed over the conductive blocking structure and the bond pad. FIGS. 18A-18B illustrate cross-sectional views corresponding to some embodiments of act 2420.

At 2420, a second etch stop layer is formed over the second passivation layer. FIGS. 18A-18B illustrate cross-sectional views corresponding to some embodiments of act 2420.

At 2422, a third passivation layer and a first hard mask layer are formed over the second etch stop layer. FIGS. 18A-18B illustrate cross-sectional views corresponding to some embodiments of act 2422.

At 2424, a first dual-damascene conductive bonding structure is formed. The first dual-damascene conductive bonding structure comprises a via segment and a wire segment. The via segment extends through the first passivation layer, the second passivation layer, and the first etch stop layer. The wire segment extends through the third passivation layer and the second etch stop layer. FIG. 19 illustrates a cross-sectional view corresponding to some embodiments of act 2424.

Figure 21:
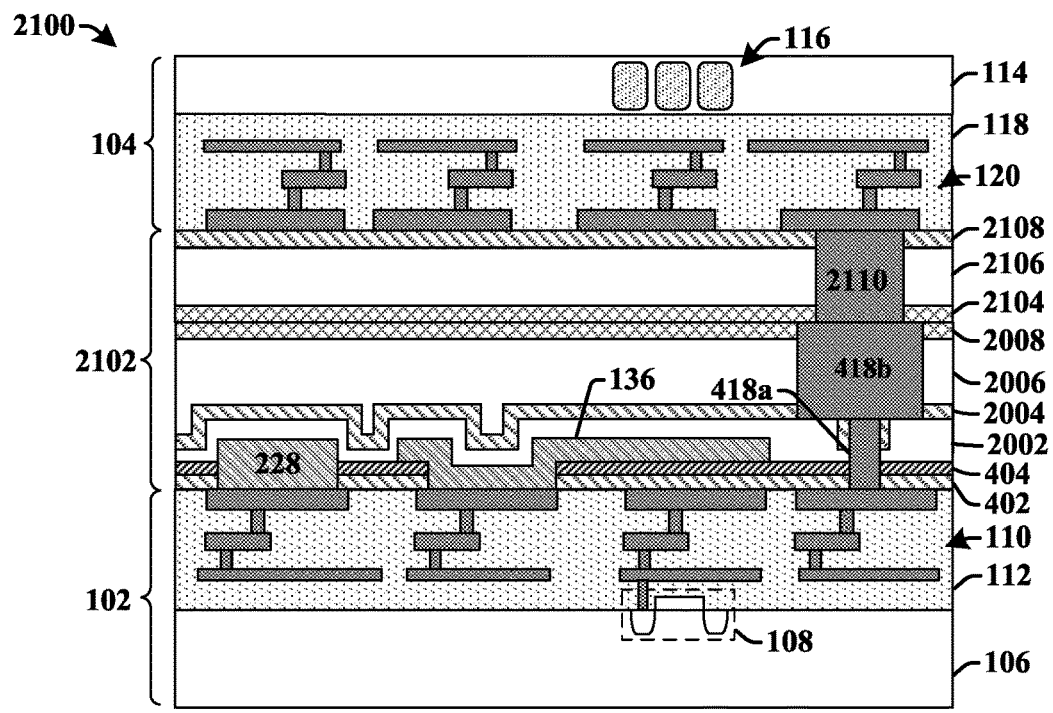

At 2426, the first integrated chip die is bonded to a second integrated chip die comprising an array of image sensing elements along a hybrid bonding interface region. FIG. 21 illustrates a cross-sectional view corresponding to some embodiments of act 2426.

Figure 22:
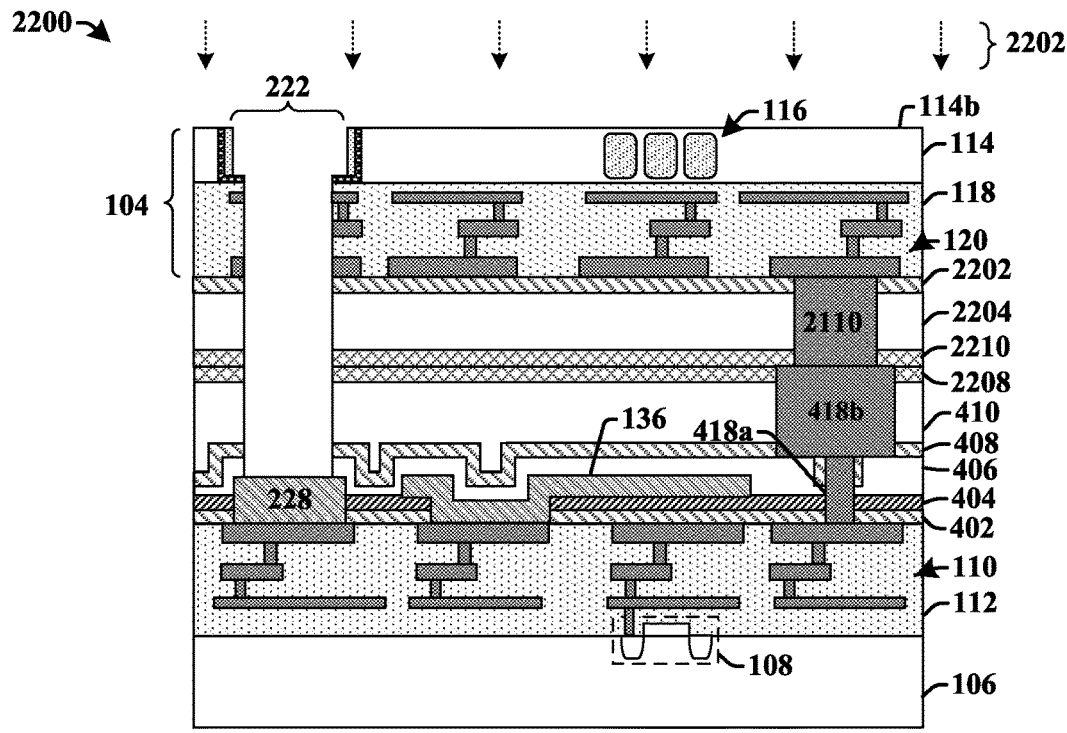

At 2428, a bond pad opening is formed to extend through the second integrated chip die and parts of the hybrid bonding interface region to the bond pad. FIG. 22 illustrates a cross-sectional view corresponding to some embodiments of act 2428.

At 2430, a conductive bump is formed on the bond pad. FIG. 23 illustrates a cross-sectional view corresponding to some embodiments of act 2430.

Therefore, the present disclosure relates to a stacked integrated chip (IC) structure having a conductive blocking structure configured prevent radiation produced by a device within a first die from affecting an image sensing element within a second die.

In some embodiments, the present disclosure relates to an integrated chip structure. The integrated chip structure comprises a first integrated chip (IC) die having one or more semiconductor devices, and a second IC die having an array of image sensing elements. A hybrid bonding interface region is arranged between the first IC die and the second IC die. A conductive bonding structure is arranged within the hybrid bonding interface region and is configured to electrically couple the first IC die to the second IC die. A conductive blocking structure is also arranged within the hybrid bonding interface region and laterally extends between the one or more semiconductor devices and the array of image sensing elements.

In other embodiments, the present disclosure relates to an integrated chip structure. The integrated chip structure comprises a first plurality of metal interconnect layers arranged within a first dielectric structure over a first substrate having one or more semiconductor devices, and a second plurality of metal interconnect layers arranged within a second dielectric structure arranged between the first dielectric structure and a second substrate having an array of image sensing elements. The integrated chip structure further comprises a conductive bonding structure arranged between the first dielectric structure and the second dielectric structure and configured to electrically couple the first plurality of metal interconnect layers to the second plurality of metal interconnect layers. The integrated chip structure further comprises a conductive blocking structure vertically arranged between the first dielectric structure and the second dielectric structure and extending laterally past the one or more semiconductor devices or the array of image sensing elements in a first direction and in a second direction perpendicular to the first direction.

In yet other embodiments, the present disclosure relates to a method of forming an integrated chip structure. The method comprises forming a first integrated chip (IC) die having one or more semiconductor devices. The method further comprises forming a conductive blocking structure over the first IC die, wherein the conductive blocking structure extends past the one or more semiconductor devices in a first direction and in a second direction perpendicular to the first direction. The method further comprises bonding the first IC die to a second IC die, having an array of image sensing elements, along a hybrid interface bonding region comprising the conductive blocking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
   a first integrated chip (IC) die having one or more semiconductor devices;
   a second IC die having an array of image sensing elements;
   a hybrid bonding interface region arranged between the first IC die and the second IC die;
   a conductive bonding structure arranged within the hybrid bonding interface region and configured to electrically couple the first IC die to the second IC die;
   a conductive blocking structure arranged within the hybrid bonding interface region at a location vertically between the one or more semiconductor devices and the array of image sensing elements, wherein the conductive blocking structure extends as a continuous structure laterally past opposing sides of the one or more semiconductor devices; and
   a first passivation layer disposed between the conductive blocking structure and the first IC die, wherein the first passivation layer has a first thickness directly below the conductive blocking structure that is larger than a second thickness of the first passivation layer laterally outside of the conductive blocking structure.

2. The integrated chip structure of claim 1,
   wherein the conductive blocking structure comprises interior sidewalls coupled to a lower interior surface to define a recess within an upper surface of the conductive blocking structure; and
   wherein the conductive blocking structure contacts an underlying metal interconnect layer directly below the lower interior surface.

3. The integrated chip structure of claim 2, further comprising:
an etch stop layer arranged within the hybrid bonding interface region between the conductive blocking structure and the second IC die, wherein the etch stop layer has interior sidewalls defining a second recess directly over the recess; and
wherein the etch stop layer laterally extends past outermost sidewalls of the conductive blocking structure.

4. The integrated chip structure of claim 2, further comprising:
a second passivation layer arranged vertically between the first passivation layer and the second IC die and laterally surrounding the conductive blocking structure; and
an etch stop layer arranged between the first passivation layer and the underlying metal interconnect layer.

5. The integrated chip structure of claim 1, further comprising:
a second passivation layer arranged over the first passivation layer and the conductive blocking structure, wherein the conductive blocking structure continuously extends from below the first passivation layer to an uppermost surface of the conductive blocking structure that is a non-zero distance below an upper surface of the second passivation layer; and
an etch stop layer contacting a bottom of the first passivation layer.

6. The integrated chip structure of claim 5, wherein the conductive blocking structure is electrically coupled to an electrically grounded one of a first plurality of metal interconnect layers within the first IC die.

7. The integrated chip structure of claim 1, further comprising:
a second passivation layer arranged between the first passivation layer and the second IC die; and
a first etch stop layer arranged between the first passivation layer and the first IC die, wherein the conductive bonding structure has a sidewall, defined by a differentiable continuous function, which extends from a bottom of the first etch stop layer, through the first passivation layer, to within the second passivation layer.

8. The integrated chip structure of claim 1, further comprising:
a bond pad coupled to a first plurality of metal interconnect layers within the first IC die at a location offset from the conductive blocking structure; and
a bond pad opening extending through the second IC die and a part of the hybrid bonding interface region to an upper surface of the bond pad.

9. The integrated chip structure of claim 8, wherein a first distance from a first semiconductor substrate within the first IC die to a bottom surface of the conductive blocking structure is greater than or equal to a second distance from the first semiconductor substrate to a bottom surface of the bond pad.

10. The integrated chip structure of claim 1, further comprising:
a second passivation layer arranged vertically between the first passivation layer and the second IC die;
a third passivation layer arranged between the second passivation layer and the second IC die; and
a second etch stop layer arranged between the second passivation layer and the third passivation layer, wherein the second etch stop layer has an outermost sidewall that is separated from a sidewall of a bond pad by the second passivation layer.

11. The integrated chip structure of claim 1, wherein the conductive blocking structure has angled outermost sidewalls, which are angled to cause a width of the conductive blocking structure to decrease as a distance from the first IC die increases.

12. The integrated chip structure of claim 1, further comprising:
a second conductive bonding structure arranged within the hybrid bonding interface region and configured to electrically couple the first IC die to the second IC die; and
wherein the conductive bonding structure extends through an opening continually surrounded by sidewalls of the conductive blocking structure and second conductive bonding structure is outside of outermost sidewalls of the conductive blocking structure.

13. An integrated chip structure, comprising:
a first plurality of metal interconnect layers arranged within a first dielectric structure over a first substrate having one or more semiconductor devices;
a second plurality of metal interconnect layers arranged within a second dielectric structure arranged between the first dielectric structure and a second substrate having an array of image sensing elements;
a conductive bonding structure arranged between the first dielectric structure and the second dielectric structure and configured to electrically couple the first plurality of metal interconnect layers to the second plurality of metal interconnect layers;
a conductive blocking structure vertically arranged between the first dielectric structure and the second dielectric structure and extending as a continuous structure laterally past opposing sides of the one or more semiconductor devices or the array of image sensing elements in a first direction and in a second direction perpendicular to the first direction; and
wherein the conductive blocking structure comprises a sidewall directly contacting sidewalls of an etch stop layer and a first passivation layer disposed between the etch stop layer and the second substrate, the first passivation layer comprising a different material than the etch stop layer.

14. The integrated chip structure of claim 13, wherein the conductive blocking structure is configured to block radiation generated by the one or more semiconductor devices from reaching the array of image sensing elements.

15. The integrated chip structure of claim 13, further comprising:
a second passivation layer arranged over the first passivation layer and the conductive blocking structure, wherein the conductive blocking structure continuously extends from a lower surface of the second passivation layer an uppermost surface of the conductive blocking structure that is a non-zero distance below an upper surface of the second passivation layer.

16. The integrated chip structure of claim 13, further comprising:
a bond pad coupled to the first plurality of metal interconnect layers at a location offset from the conductive blocking structure; and
a bond pad opening extending through the second substrate to an upper surface of the bond pad.

17. The integrated chip structure of claim 16, wherein a first distance from the first substrate to a bottom surface of the conductive blocking structure is greater than or equal to a second distance from the first substrate to a bottom surface of the bond pad.

18. The integrated chip structure of claim 13, wherein the conductive blocking structure has opposing outermost sidewalls, which are angled to cause a width of the conductive blocking structure to decrease as a distance from the first dielectric structure increases.

19. An integrated chip structure, comprising:
a first plurality of interconnect layers within a first dielectric structure over a first substrate having one or more semiconductor devices;
a second plurality of interconnect layers within a second dielectric structure between the first dielectric structure and a second substrate having an image sensing element;
a conductive bonding structure electrically coupling the first plurality of interconnect layers and the second plurality of interconnect layers;
a blocking structure disposed between the first plurality of interconnect layers and the second plurality of interconnect layers, wherein the blocking structure comprises interior sidewalls coupled to a lower interior surface to define a recess within an upper surface of the blocking structure and wherein the blocking structure contacts an underlying metal interconnect layer at a point that is directly below the lower interior surface; and
wherein the blocking structure is arranged along a line extending between the one or more semiconductor devices and the image sensing element.

20. The integrated chip structure of claim 19,
wherein the blocking structure comprises a first region coupled to a blocking region by way of a connection region; and
wherein the first region has a first width in a first direction that is greater than a second width of the connection region in the first direction and that is less than a third width of the blocking region in the first direction.

* * * * *